(12) United States Patent
Qi et al.

(10) Patent No.: US 11,502,010 B2
(45) Date of Patent: Nov. 15, 2022

(54) MODULE INSTALLATION ON PRINTED CIRCUIT BOARDS WITH EMBEDDED TRACE TECHNOLOGY

(71) Applicant: Intel Corporation, Santa Clara, CA (US)

(72) Inventors: Quan Qi, Beaverton, OR (US); Carlton E. Hanna, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 16/329,057

(22) PCT Filed: Oct. 1, 2016

(86) PCT No.: PCT/US2016/055081
§ 371 (c)(1),
(2) Date: Feb. 27, 2019

(87) PCT Pub. No.: WO2018/063414
PCT Pub. Date: Apr. 5, 2018

(65) Prior Publication Data
US 2019/0221488 A1 Jul. 18, 2019

(51) Int. Cl.
*H01L 23/13* (2006.01)
*H01L 23/498* (2006.01)
(Continued)

(52) U.S. Cl.
CPC ............ *H01L 23/13* (2013.01); *H01L 21/486* (2013.01); *H01L 21/4857* (2013.01); *H01L 21/6835* (2013.01); *H01L 23/49811* (2013.01); *H01L 23/49816* (2013.01); *H01L 23/5383* (2013.01); *H01L 23/5389* (2013.01);
(Continued)

(58) Field of Classification Search
CPC combination set(s) only.
See application file for complete search history.

(56) References Cited

U.S. PATENT DOCUMENTS

| 2006/0255102 | A1* | 11/2006 | Snyder | .................... H01L 24/13 228/180.1 |
| 2008/0185704 | A1 | 8/2008 | Hsu et al. | |

(Continued)

FOREIGN PATENT DOCUMENTS

| JP | 2006-196925 | 7/2006 |
| KR | 10-1314544 | 10/2013 |

OTHER PUBLICATIONS

International Search Report and Written Opinion for International Patent Application No. PCT/US2016/055081 dated May 23, 2017, 14 pgs.

(Continued)

*Primary Examiner* — Xanthia C Cunningham
(74) *Attorney, Agent, or Firm* — Schwabe Williamson & Wyatt PC

(57) ABSTRACT

Embodiments are generally directed to module installation on printed circuit boards with embedded trace technology. An embodiment of a printed circuit board includes one or more layers including a top layer; multiple embedded traces that are contained in an area of a surface of a first layer of the one or more layers of the printed circuit board; and a first module, the first module being installed on the plurality of printed traces in the area.

14 Claims, 20 Drawing Sheets

(51) Int. Cl.
　　　H01L 21/48　　(2006.01)
　　　H05K 3/46　　(2006.01)
　　　H05K 1/18　　(2006.01)
　　　H01L 21/683　(2006.01)
　　　H01L 23/538　(2006.01)
　　　H01L 23/00　　(2006.01)
　　　H01L 25/16　　(2006.01)
　　　H01L 25/18　　(2006.01)
　　　H05K 3/00　　(2006.01)
　　　H05K 3/20　　(2006.01)
(52) U.S. Cl.
　　　CPC ............ *H01L 24/16* (2013.01); *H01L 24/32* (2013.01); *H01L 24/48* (2013.01); *H01L 24/73* (2013.01); *H01L 24/81* (2013.01); *H01L 25/16* (2013.01); *H01L 25/18* (2013.01); *H05K 1/183* (2013.01); *H05K 3/4682* (2013.01); *H01L 23/498* (2013.01); *H01L 23/49822* (2013.01); *H01L 2221/68345* (2013.01); *H01L 2221/68359* (2013.01); *H01L 2224/13147* (2013.01); *H01L 2224/16225* (2013.01); *H01L 2224/16227* (2013.01); *H01L 2224/32145* (2013.01); *H01L 2224/48091* (2013.01); *H01L 2224/48227* (2013.01); *H01L 2224/73253* (2013.01); *H01L 2224/73265* (2013.01); *H01L 2224/81815* (2013.01); *H01L 2924/00014* (2013.01); *H01L 2924/1421* (2013.01); *H01L 2924/1432* (2013.01); *H01L 2924/1434* (2013.01); *H01L 2924/1436* (2013.01); *H01L 2924/15311* (2013.01); *H01L 2924/19041* (2013.01); *H01L 2924/19042* (2013.01); *H01L 2924/19102* (2013.01); *H01L 2924/19105* (2013.01); *H01L 2924/19106* (2013.01); *H05K 3/0097* (2013.01); *H05K 3/205* (2013.01); *H05K 3/4697* (2013.01); *H05K 2201/0989* (2013.01); *H05K 2201/10674* (2013.01)

(56) References Cited

U.S. PATENT DOCUMENTS

| | | | |
|---|---|---|---|
| 2011/0133327 A1* | 6/2011 | Hsu | H01L 23/498 257/E23.06 |
| 2011/0278741 A1* | 11/2011 | Chua | H01L 23/48 257/777 |
| 2013/0256850 A1* | 10/2013 | Danny | H01L 23/66 257/664 |
| 2014/0070421 A1* | 3/2014 | Tremlett | H01L 25/0657 257/773 |
| 2014/0093999 A1* | 4/2014 | Teh | H01L 21/568 438/107 |
| 2015/0156882 A1* | 6/2015 | Bong | H05K 1/185 257/690 |
| 2016/0143137 A1* | 5/2016 | Baek | H01L 21/4857 361/767 |
| 2016/0157353 A1 | 6/2016 | Choi et al. | |
| 2016/0174382 A1* | 6/2016 | Kraft | H01L 23/5383 361/688 |
| 2016/0198568 A1* | 7/2016 | Park | H05K 3/4682 361/768 |
| 2016/0219712 A1* | 7/2016 | Ko | H01L 24/13 |
| 2016/0225706 A1* | 8/2016 | Cho | H01L 23/49827 |
| 2018/0286815 A1* | 10/2018 | Qi | H01L 23/49838 |
| 2020/0152566 A1* | 5/2020 | Oh | H01L 23/49822 |

OTHER PUBLICATIONS

International Preliminary Report on Patentability for International Patent Application No. PCT/US2016/055081 dated Apr. 11, 2019, 7 pgs.

\* cited by examiner

MODULE INSTALLATION ON PRINTED CIRCUIT BOARDS WITH EMBEDDED TRACE TECHNOLOGY

CROSS-REFERENCE TO RELATED APPLICATION

This patent application is a U.S. National Phase Application under 35 U.S.C. § 371 of International Application No. PCT/US2016/055081, filed Oct. 1, 2016, entitled "MODULE INSTALLATION ON PRINTED CIRCUIT BOARDS WITH EMBEDDED TRACE TECHNOLOGY," which designates the United States of America, the entire disclosure of which is hereby incorporated by reference in its entirety and for all purposes.

TECHNICAL FIELD

Embodiments described herein generally relate to the field of electronic devices and, more particularly, module installation on printed circuit boards with embedded trace technology.

BACKGROUND

More and more integrations are driving technology advances such as SoC (System on Chip), SiP (System in Package), DCA (Direct Chip Attach), and COB or Chip On Board).

For connectivity solutions, most final products are currently in the forms of modules based on PCB technologies, with substrate based SiP solutions also being emerging technologies. Compared with substrate based SiP solutions, PCB based module solutions can provide a significant cost advantage, particularly for the mainstream HVM (High Volume Manufacturing) connectivity products.

However, certain module integration technologies are not easily implemented with PCB technologies. In particular, the fine pitches required are often not obtainable with PCB technology.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to module installation on printed circuit boards with embedded trace technology.

For the purposes of this description:

"Printed circuit board" or "PCB" refers to a non-conductive substrate that mechanically supports and electrically connects electronic components using conductive tracks, pads and other features.

In some embodiments, module installation on printed circuit boards with embedded trace technology.

In some embodiments, a PCB manufacturing process is utilized to generate a high density embedded trace routing layer that is utilized for module integration on the circuit board. In some embodiments, the embedded trace technology is applied for direct chip attach or chip-on-board integrations where high density routing is needed to support the signal escapes of the silicon chips, which typically involve tight pitch pad-outs and present a challenge for even high density interconnect (HDI) based PCB routing. As used herein, technology for the fabrication of embedded trace for PCB may be referred to as embedded trace PCB (or ETP) technology.

Current connectivity module solutions include packaging silicon devices (or other semiconductor devices) into a package (typically utilizing a more costly BT based substrate) at, for example, an OSAT (Outsourced Semiconductor Assembly and Test), and then shipping such package to the ODM (Original Design Manufacturer) to be assembled onto another PCB along with SMT (Surface Mount Technology) components, resulting in a complex supply chain and long turnaround time for the full manufacture process.

In some embodiments, a process combines PCB embedded trace technology with HDI (High Density Interconnect) PCB technologies to fabricate a PCB. In this manner, embedded trace and HDI technologies may be applied to simplify the supply chain, reduce costs, and meet the technology challenges in terms of routing flexibility, density, electrical performance, and scalability.

In some embodiments, a PCB manufacturing process allows for leveraging the embedded trace technology in high density substrate manufacturing and PCB via technologies to generate a printed circuit board that enables PCB based module solutions involving flip chip direct chip attach and SMT components.

Figure 1:
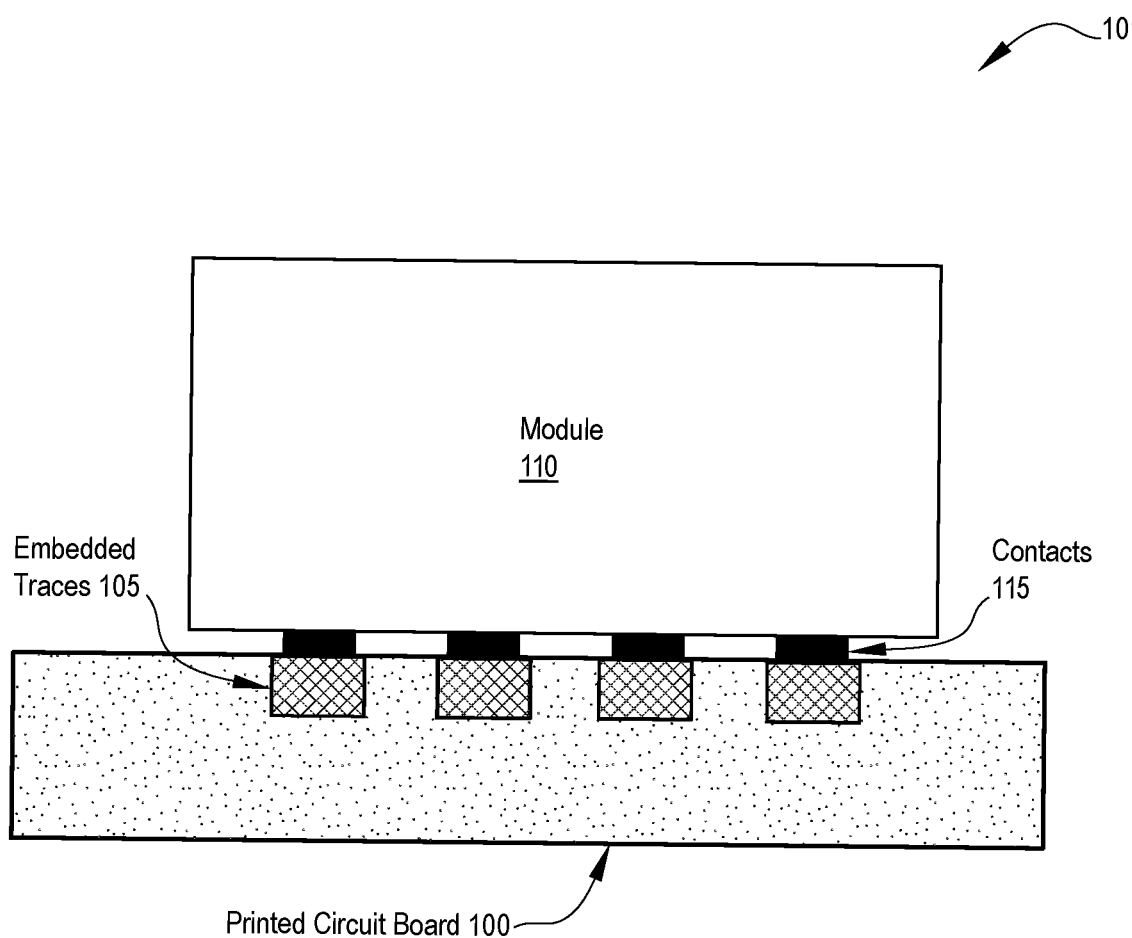
FIG. 1 is an illustration of a module installed a package substrate utilizing on embedded traces according to an embodiment.

FIG. 1 is an illustration of a module installed a package substrate utilizing on embedded traces according to an embodiment. In some embodiments, a module 110 including contacts 115 is installed on a printed circuit board 100 that includes embedded traces 105 in an area of a layer, wherein the embedded traces may be traces installed pursuant to FIGS. 2A to 2K, and as illustrated in FIGS. 5 through 8.

Conventional PCB technologies generally support 40/40 µm (micrometer) trace/spacing L/S design rules, with more advanced development potentially providing 25/25 µm capabilities. However, this pitch is not sufficient for installation of certain technologies. In contrast, embedded trace technology has established trace/spacing capabilities of 12/12 μm to 7/7 μm. In some embodiments, embedded trace technology is integrated into printed circuit board technology, thus enabling significantly finer traces for module installation on a printed circuit board.

Figure 7:
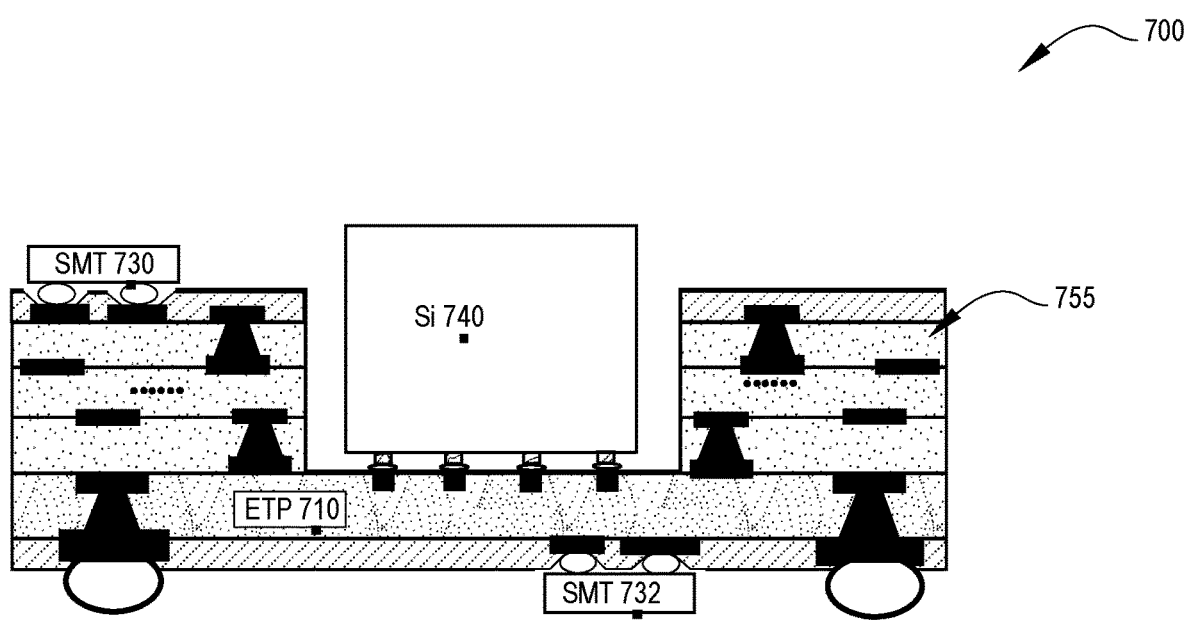
FIG. 7 is an illustration of embedded trace technology applied in a flip chip cavity PCB according to an embodiment.
Figure 8:
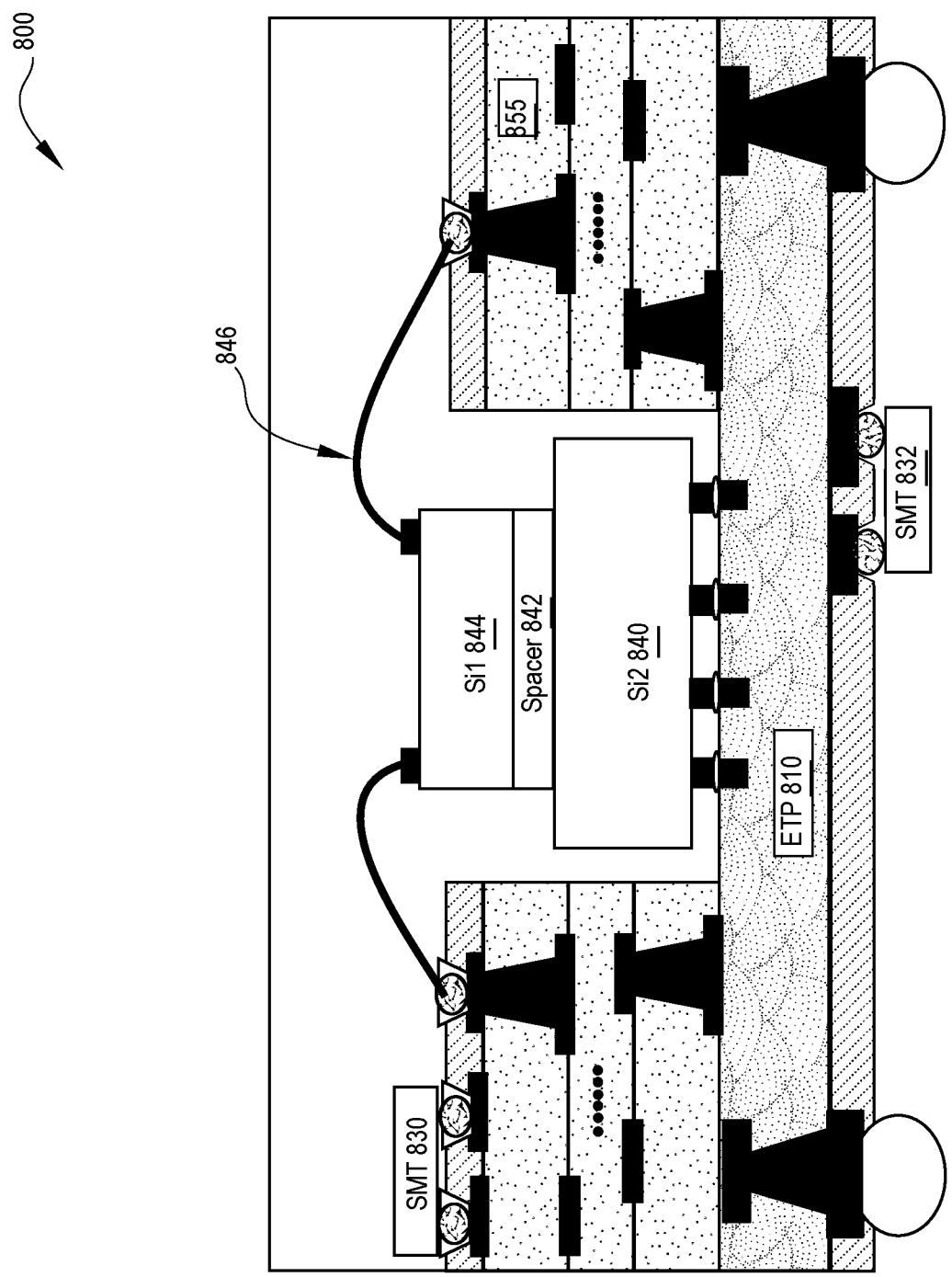
FIG. 8 is an illustration of embedded trace technology applied in a flip chip hybrid cavity PCB according to an embodiment.
Figure 9:
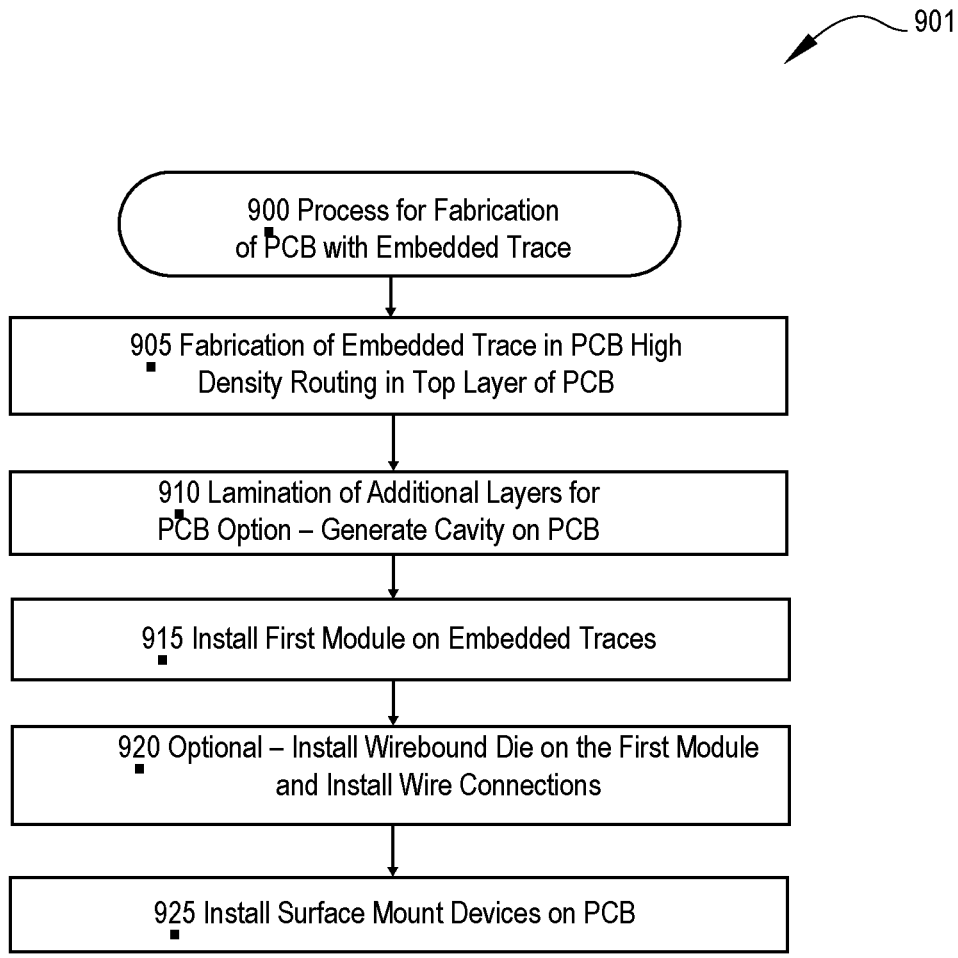
FIG. 9 is an illustration of a process for fabrication of a system including the embedded trace technology.

FIGS. 2A to 2K illustrate a printed circuit board including embedded traces and a process for fabricating a printed circuit board utilizing embedded trace technology according to an embodiment. FIGS. 2A to 2K illustrate an embedded trace PCB panel level manufacturing process. In some embodiments, a resulting surface may be utilized in flip chip installation, such as in the connectivity space. In some embodiments, the surface is further laminated with additional PCB layers to meet a particular product requirements, such as illustrated in FIGS. 7, 8, and 9.

Figure 2A:
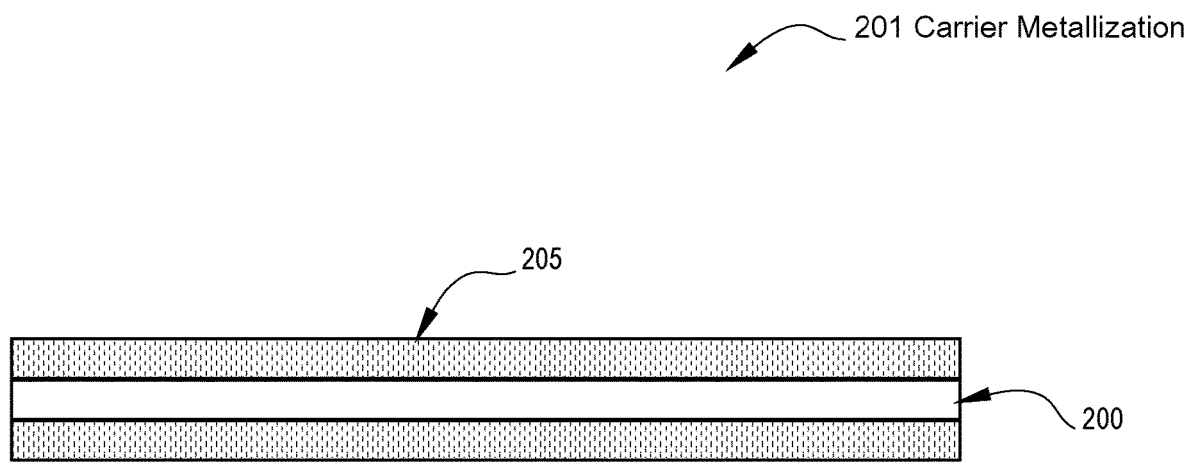
FIGS. 2A to 2K illustrate a printed circuit board including embedded traces and a process for fabricating a printed circuit board utilizing embedded trace technology according to an embodiment.

In some embodiments, embedded trace technology is expanded in fabrication of an apparatus or system as follows:

FIG. 2A: Carrier metallization, with metal seed layer 205 applied to a carrier substrate 200. In some embodiments, the carrier is constructed of stainless steel or other similar material.

Figure 2B:
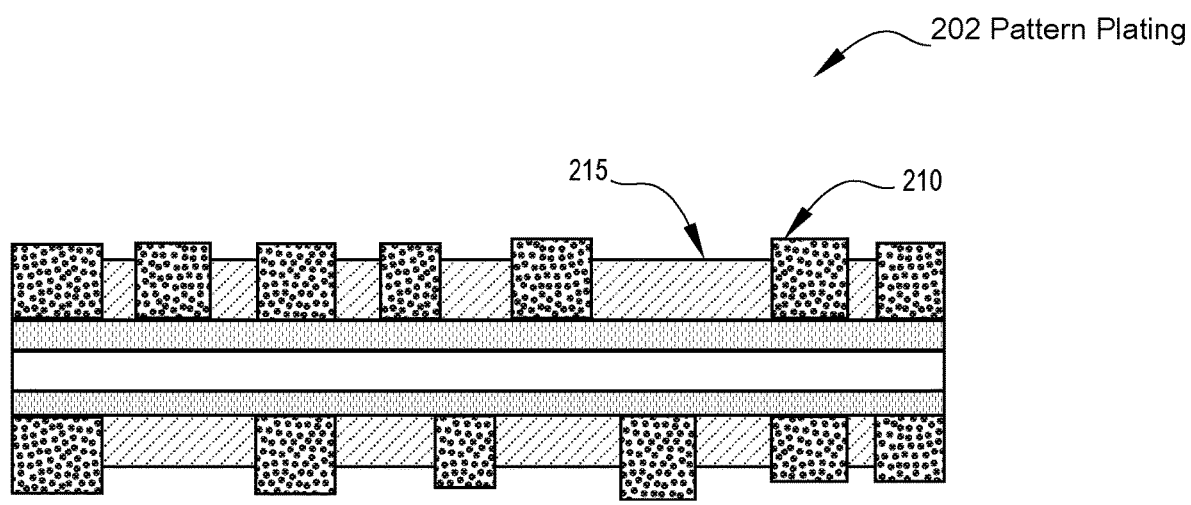

FIG. 2B: Pattern plating, wherein a pattern of photo resist 210 is used to control the application of plating material 215.

Figure 2C:
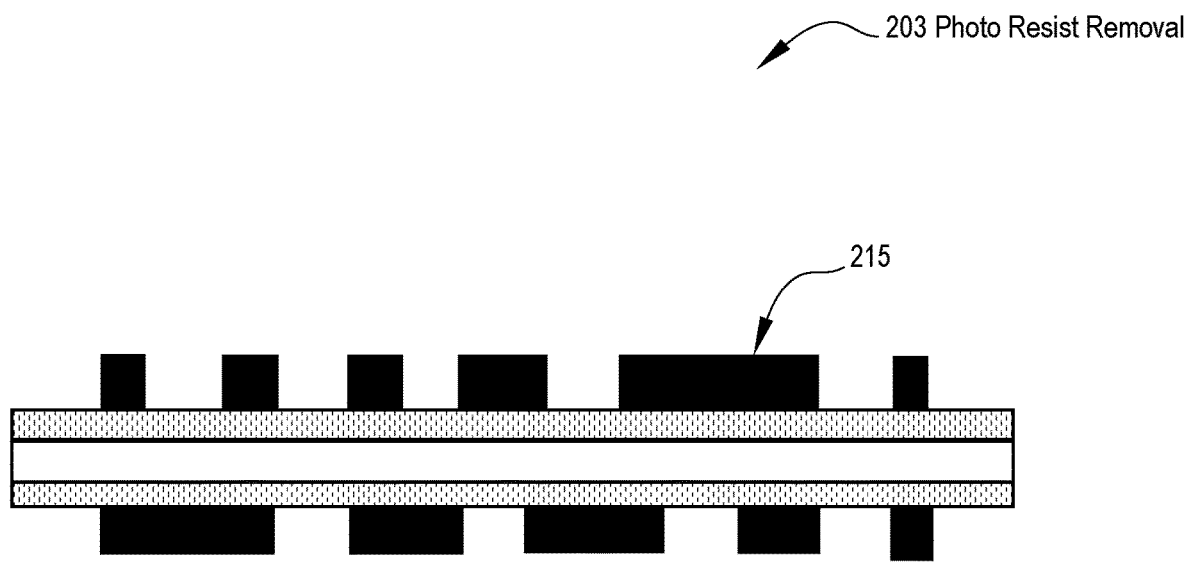

FIG. 2C: Photo resist removal, leaving a resulting pattern of plating material 215.

Figure 2D:
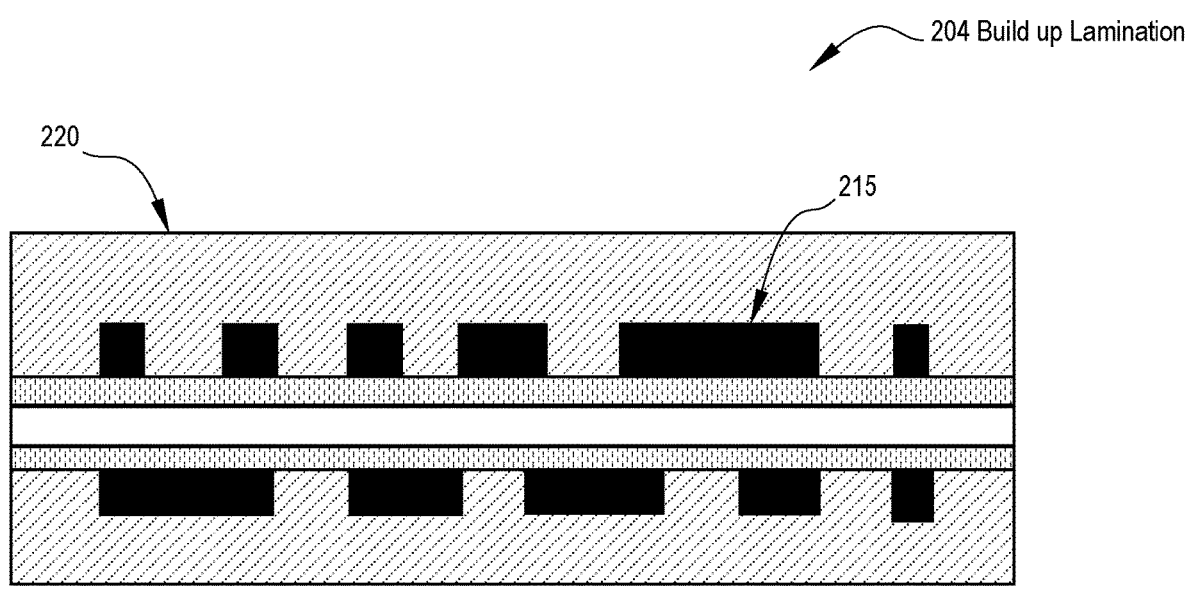

FIG. 2D: Lamination material 220 is built up on the device, including between the resulting pattern of plating material 215.

Figure 2E:
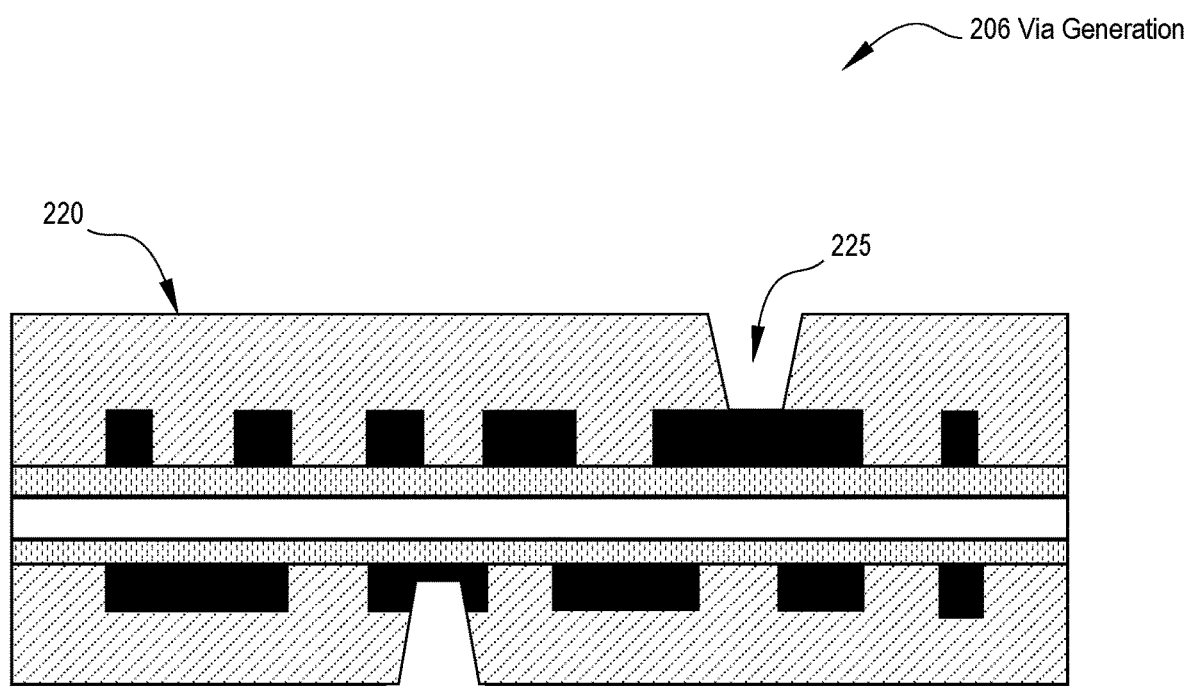

FIG. 2E: Generation of vias 225 through the lamination material 220, providing access to the pattern 215.

Figure 2F:
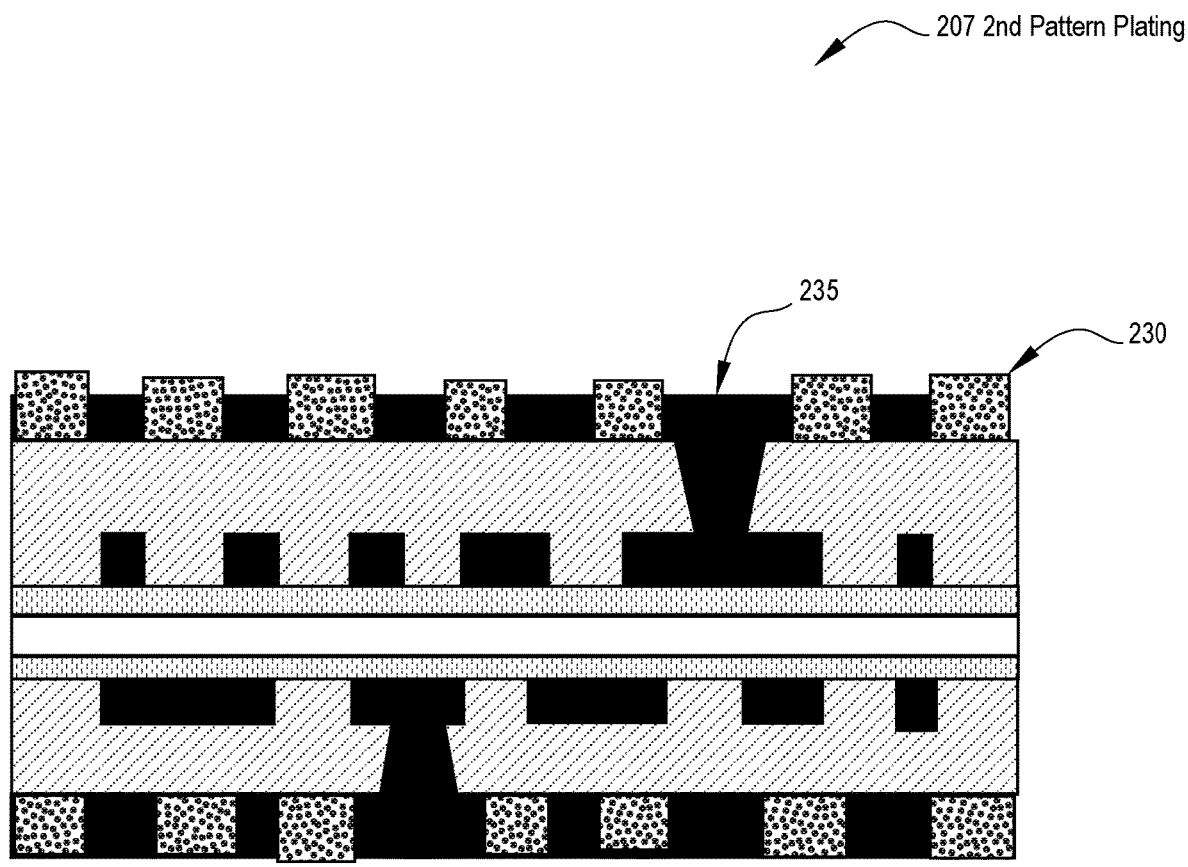

FIG. 2F: A second pattern plating, shown as photo resist 230 and plating material 235, the plating including filling of the formed vias.

Figure 2G:
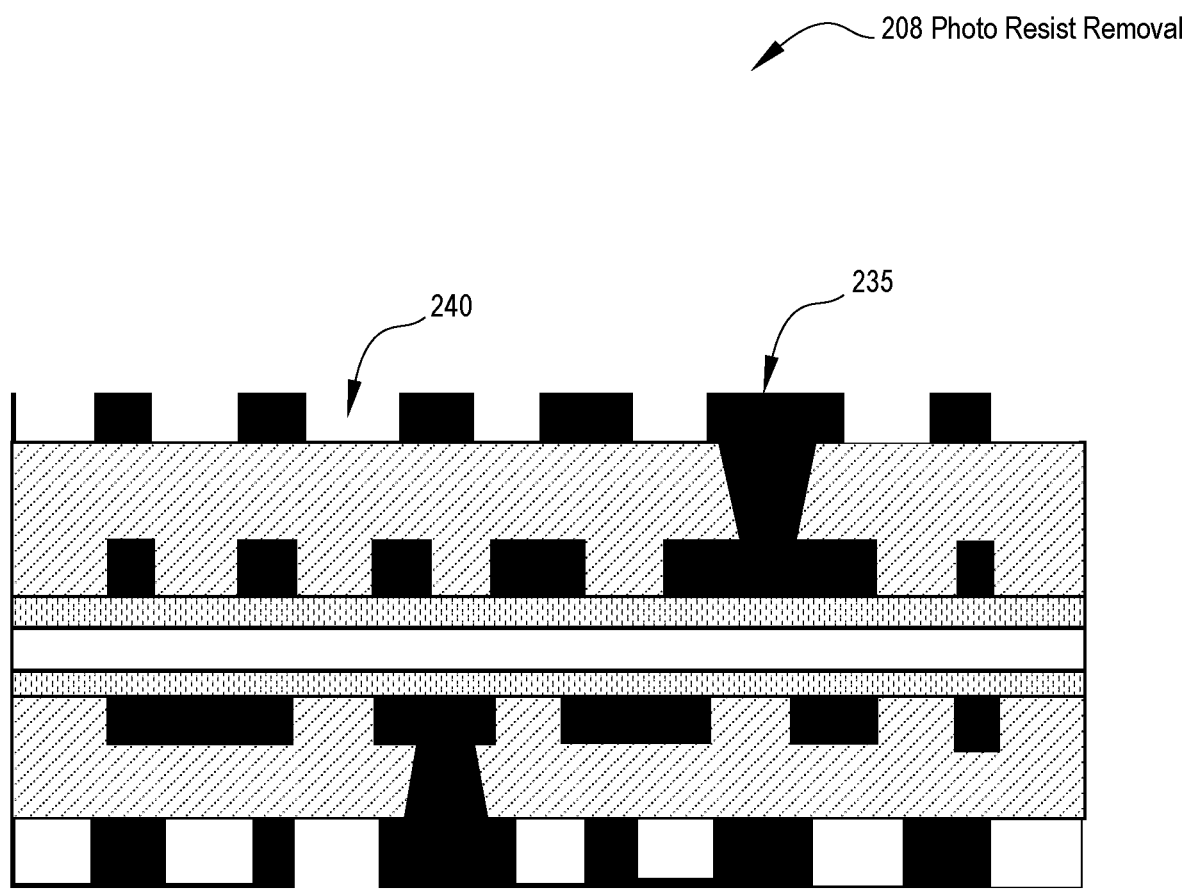

FIG. 2G: Photo resist removal, resulting in gaps 240 between the resulting pattern of plating material 235.

Figure 2H:
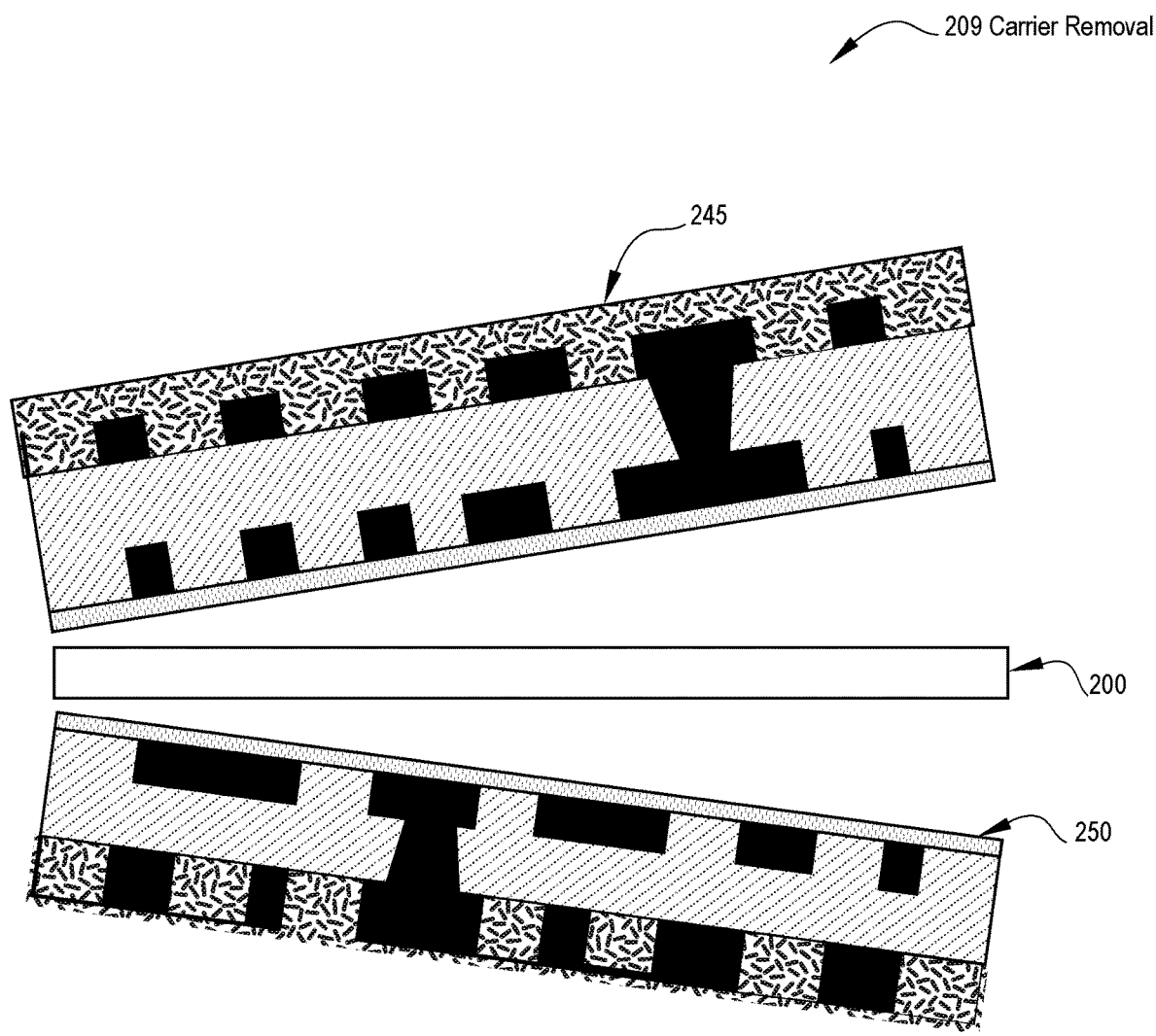

FIG. 2H: Carrier removal, separating the resulting first circuit board 245 and second circuit board 250 from the carrier substrate 200.

Figure 2I:
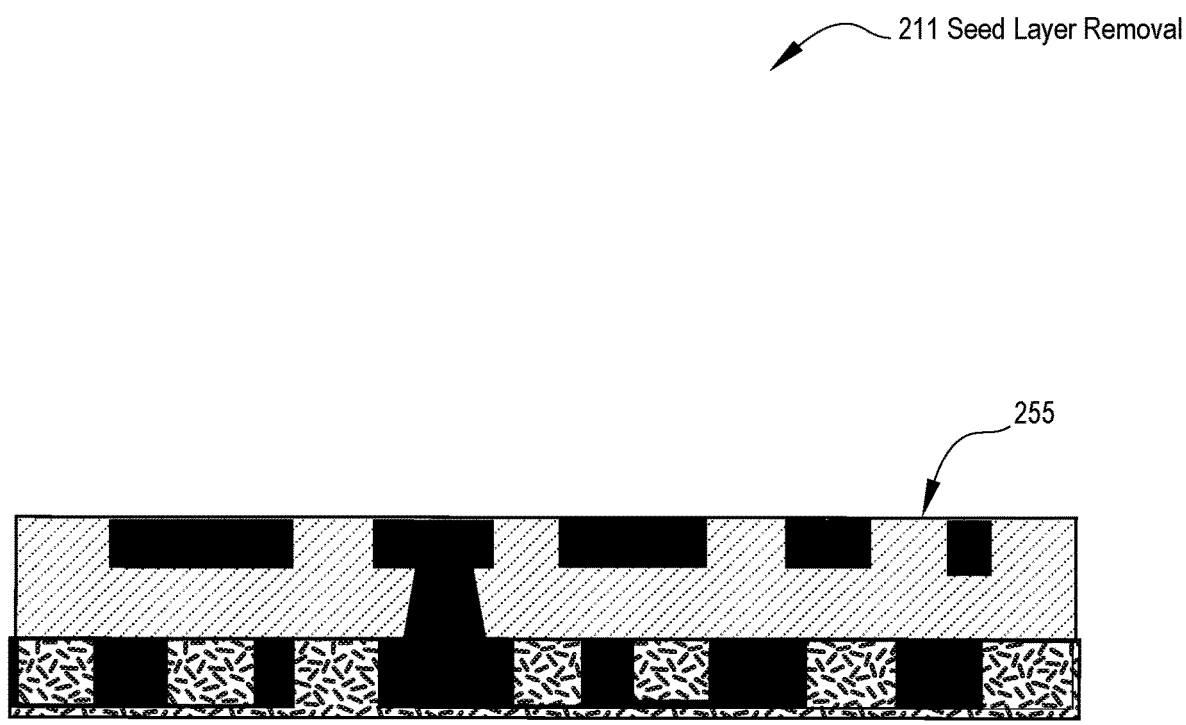

FIG. 2I: Seed layer removal in which the seed layer 205 (illustrated in FIG. 2A) is removed, resulting in a revealed surface 255.

Figure 2J:
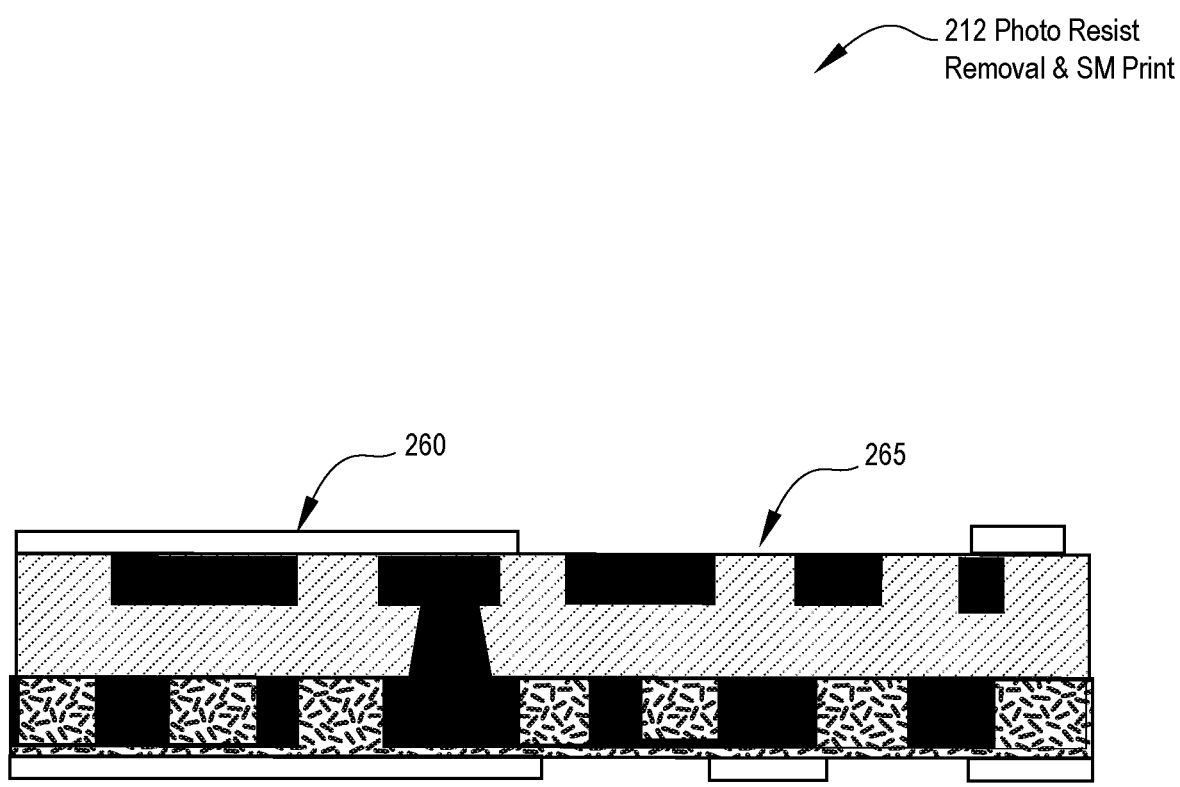

FIG. 2J: Photo resist removal and SM (solder mask) print, resulting in masked surfaces 260 and embedded trace surfaces 265. In some embodiments, there is no solder mask coverage in an area in which silicon is to be located in order to allow for simple assembly with either capillary underfill or nonflow underfill operation.

Figure 2K:
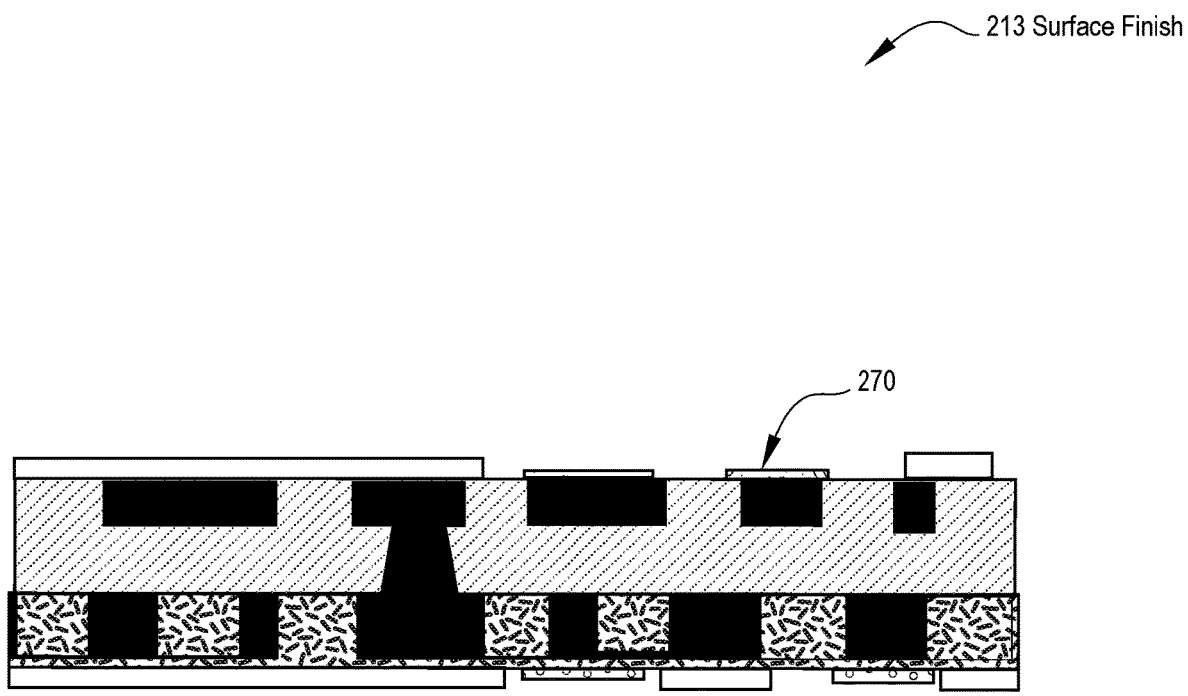

FIG. 2K: Surface finishing resulting in the embedded traces 270 for installation of modules onto the printed circuit board. The outcome of the fabrication process is a top layer PCB that can be used for subsequent lamination with other layers, whose number is determined by the routing needs of particular applications.

Figure 3:
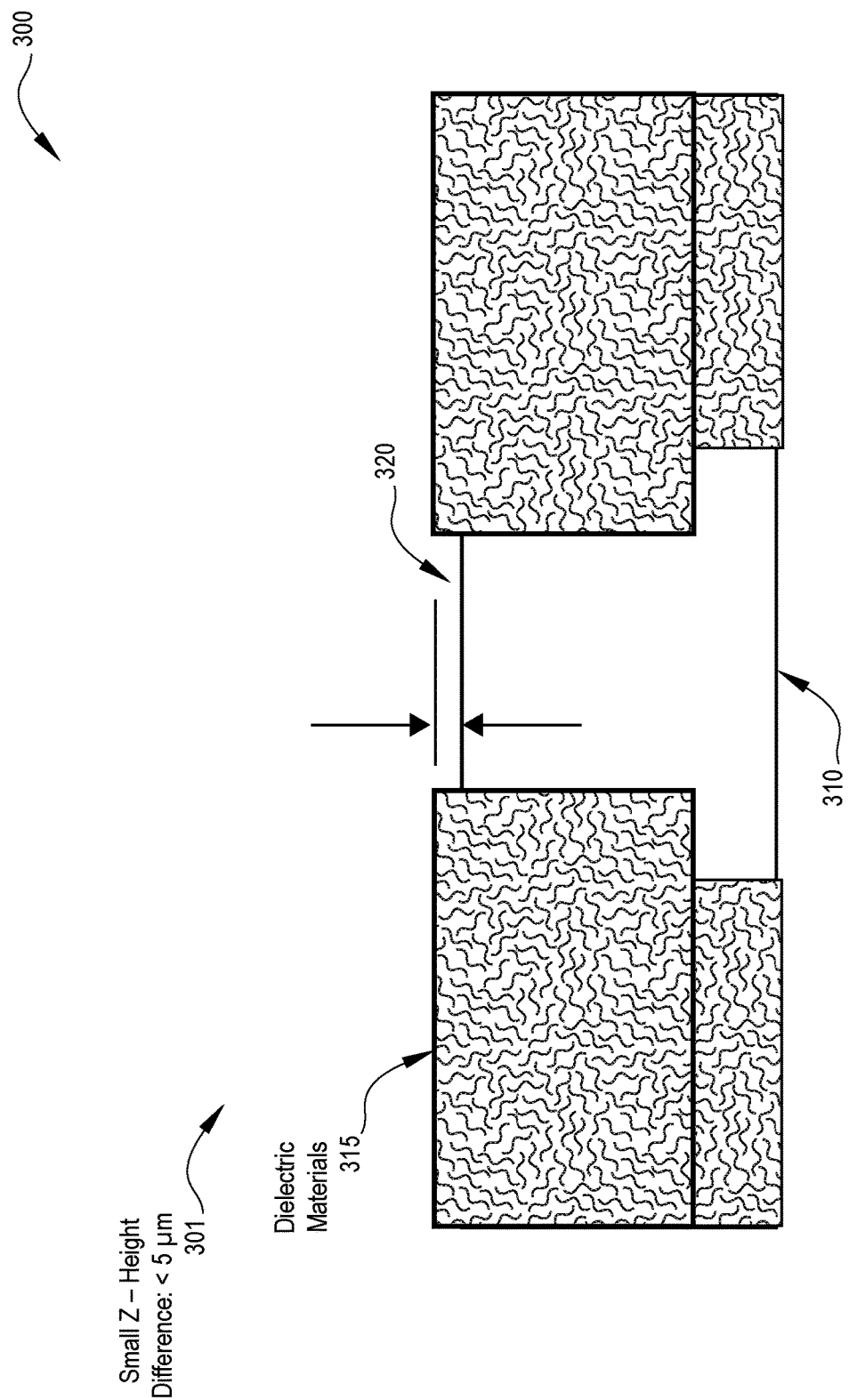
FIG. 3 is an illustration of an embedded trace fabricated in a printed circuit board according to an embodiment.

FIG. 3 is an illustration of an embedded trace fabricated in a printed circuit board according to an embodiment. As illustrated in FIG. 3, a resulting PCB 300 from an embedded trace fabrication process includes a copper pad (Cu-pad) for an embedded trace 320 within the laminated dielectric materials, the embedded trace providing contact with an internal metal layer 310. In some embodiments, the embedded trace plating process with the use of a carrier (for example a carrier made of stainless steel), results in a PCB surface having very small Z-height difference between Cu-pads 320 and dielectric materials 315. In some embodiments, the Z-height difference is less than 5 μm, as illustrated in FIG. 3. More particularly, the embedded trace process results in a Z-height difference in a range between 3 μm and 5 μm The close tolerance in Z-height for the dielectric surface and the copper pads for the embedded traces enables the placement of pads close to each other, which is very important for accommodating the flip chip bump interconnections, especially for Cu-pillar bumped dice where reflow of the solder tip on top of the copper pillar allow connections to be made The surface layer of an embedded trace PCB according to an embodiment is in contrast with the conventional surface layer finish where flip chip pads are typically defined either by solder mask (SMD, Solder Mask Defined) or by metal pads themselves (NSMD, Non-Solder Mask Defined). In the case of NSMD, due to solder spreading during reflow, sufficient fine pitch is difficult to achieve to support flip chip applications; and in the case of SMD, voiding is a concern in the absence of SOP (solder on pad) during flip chip bump reflow due to Z-height difference associated with solder mask that is approximately 25 μm in thickness. In some embodiments, PCB modules based on ETB technologies allow all components, including flip chip die/dice, to be SMT placed using, for example, a chip shooter in tape form reel form, and thus providing high throughput in manufacturing.

Figure 4:
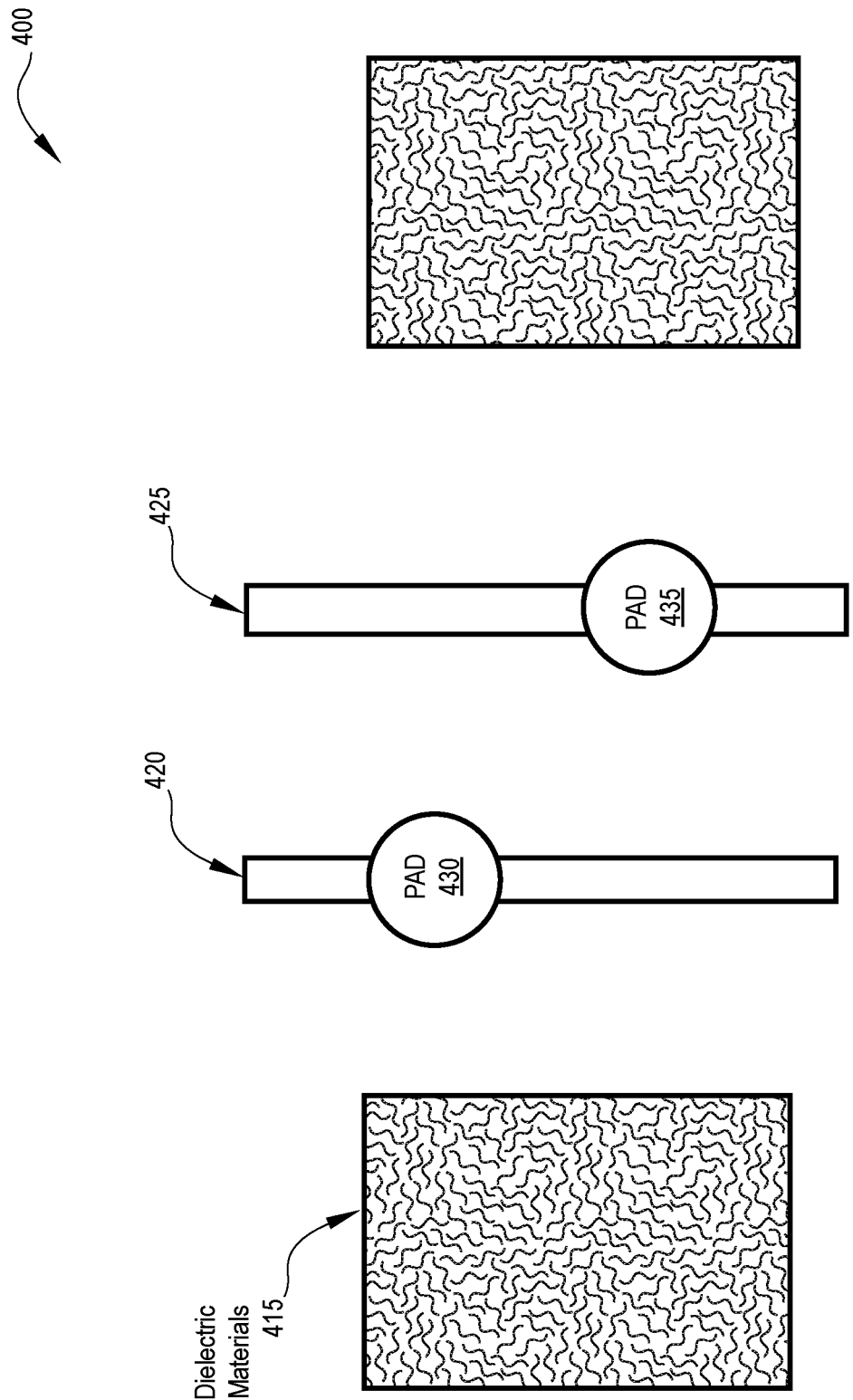
FIG. 4 is an illustration of pad installation for embedded trace according to an embodiment.

FIG. 4 is an illustration of pad installation for embedded trace according to an embodiment. As illustrated, in a view of a printed circuit board 400, there are multiple embedded traces 420-425 between the dielectric materials 415, wherein trace 420 includes pad 430 and trace 425 includes pad 435. In some embodiments, a bump-on-trace pad design allows flexible placement of flip chip bumps, especially Cu-pillar bump patterns with embedded trace enabled PCB module design. In this manner, a process removes the need to rely on a solder mask to define the pad area.

In some embodiments, the bumping mask is further optimized such that flip chip bumps do not have to be of "circular shape" to help facilitate the design flexibility without impacting reliabilities.

In conventional device fabrication, with solder mask defined flip chip pads, solder on pad is usually required to avoid voiding during assembly. However, solder on pad typically required added cost (for example additional costs on the order of ~20% for low cost modules.

The small Z-height difference in Cu-pad and dielectric materials shown in FIG. 4 significantly reduce the voiding possibility, and make SOP unnecessary.

Figure 5:
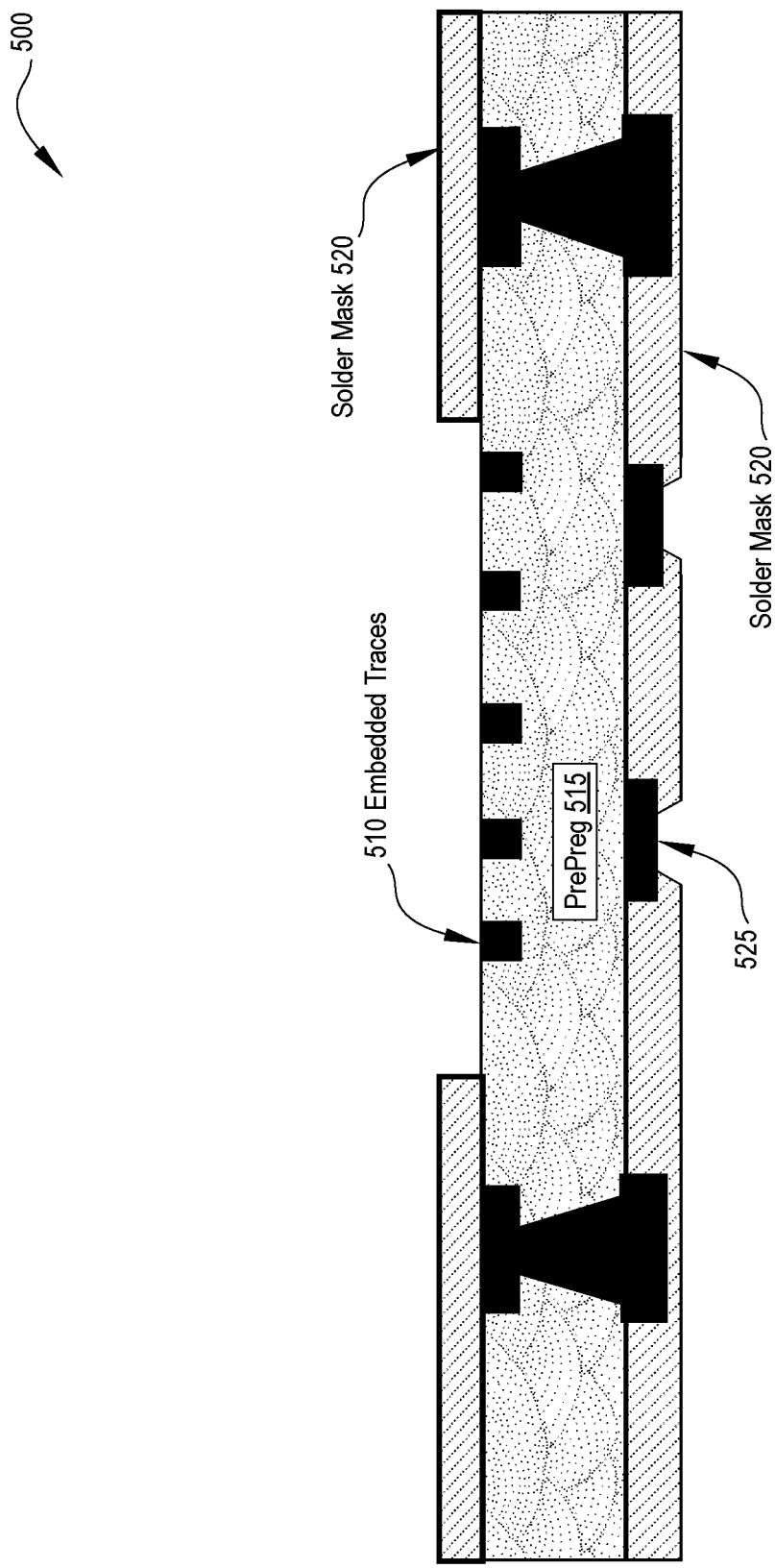
FIG. 5 is an illustration of printed circuit board with embedded traces according to an embodiment.

FIG. 5 is an illustration of printed circuit board with embedded traces according to an embodiment. In some embodiments, high density PCB manufacturing technologies, such as illustrated in FIGS. 2A to 2K including fine line and spacing, together with laser HDI via processes are utilized to generate a printed circuit board for the PCB based module solutions with flip chip direct chip attach and SMT components.

As illustrated in FIG. 5, an embodiment of a printed circuit board 500 includes embedded traces 510 within the prepreg material 515. In some embodiments, the embedded traces include a width and spacing of less than 25 μm. In some embodiments, the embedded traces include a width and spacing of less than 13 μm.

As illustrated, the PCB 500 further includes a solder mask 520 surrounding areas such as contact 525, while there is no solder mask immediately adjacent to the embedded trace 510. In some embodiments, embedded trace substrate technology is utilized for PCB based module integration, which is referred to herein as embedded trace PCB (ETP) technology. The ETP technology provides a platform solution for PCB based module products with the following potential advantages:

(1) Enabling a simpler supply-chain by reducing separate silicon packaging and module assembly into a single direct chip attached solution;

(2) Reducing the time to market (TTM) for an apparatus or system; and (3) Reducing the overall product cost with a simpler BOM bill of materials (4) Offer a path to smaller form factor to fit in a wide variety of applications.

Figure 6:
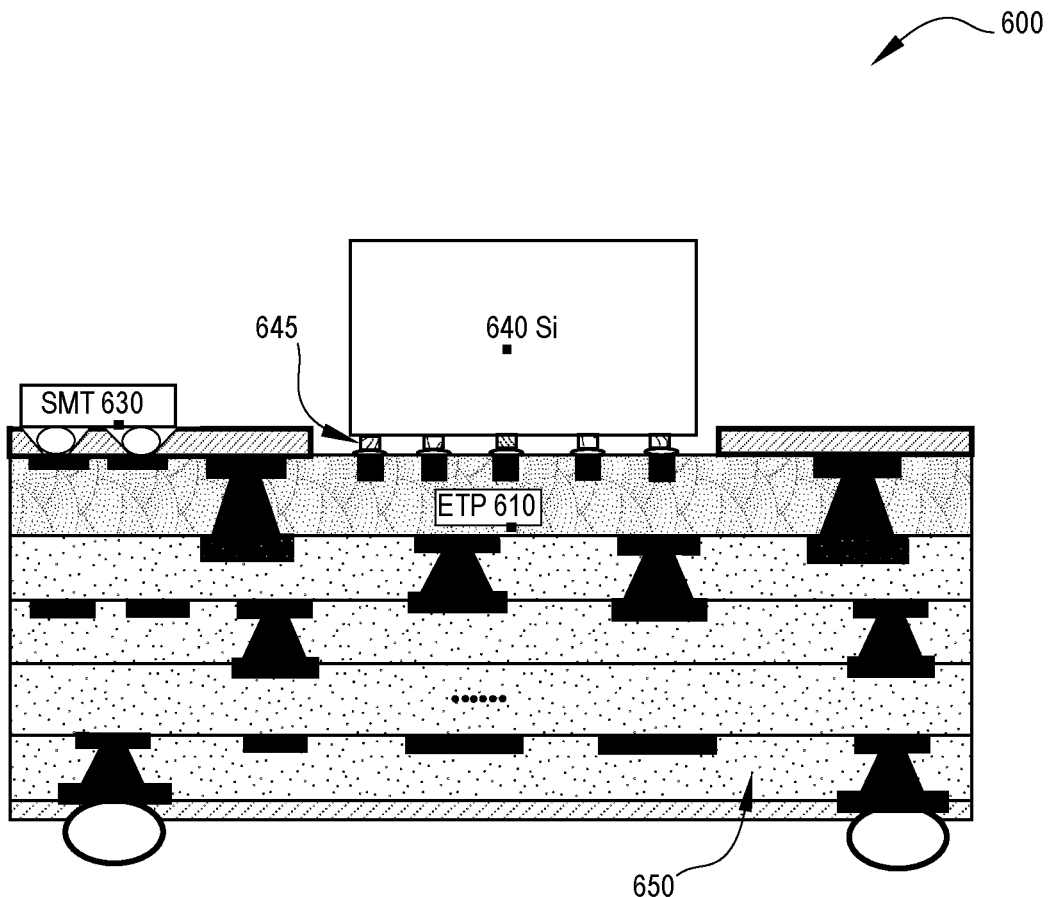
FIG. 6 is an illustration of a printed circuit including embedded traces according to an embodiment.

FIG. 6 is an illustration of a printed circuit including embedded board trace PCB technology used as a top routing layer according to an embodiment. As illustrated in FIG. 6, a printed circuit board 600 includes embedded trace technology 610 to enable installation of a silicon module 640 with high density contacts 645. In some embodiments, the printed circuit board further includes one or more SMT installed components 630.

As illustrated in FIG. 6, the high density routing capability of the ETP is applied in top routing layer of a PCB 600, above device layers 650, to assist in routing dense interconnections, wherein such interconnections would commonly be associated with flip chip bumps in a typical module application. The embedded traces support the component assembly, and the other layers 650 of the PCB 600 may include conventional PCB prepregs and interlayer connections, which may be supported by a laser-generated via process. The bottom side of the PCB can be either a ball grid array (BGA, as shown in FIG. 6) or a land grid array (LGA) where a plated Cu-plate pads replace solder.

In some embodiments, the embedded trace PCB process may utilize a solder mask as needed when the PCB is a single layer design, and, when the PCB is not a single layer, the ETP layer can be laminated with other PCB layers to form PCB structures. In some embodiments, the PCB structure may include direct chip attached and chip on board module applications.

FIG. 7 is an illustration of embedded trace technology applied in a flip chip cavity PCB according to an embodiment. As illustrated in FIG. 7, a printed circuit board 700 includes embedded trace technology 710 to enable installation of a silicon module 740. In some embodiments, the printed circuit board further includes one or more SMT installed components 730, 732.

As illustrated in FIG. 7, a configuration of a PCB enables flip chip installation with ETP 710 under the silicon module 740, with the PCB further including additional layers built up above the surface of the embedded trace layer to create a cavity into which the module 740 is placed. In some embodiments, the implementation provides flexibility to accommodate where the SMT components may be attached, including attachment of an SMT component 730 on a top layer and attachment of an SMT component 732 on a bottom layer. In some embodiments, the PCB 700 minimizes the module z-height by utilizing the cavity for installation of the module 740.

FIG. 8 is an illustration of embedded trace technology applied in a flip chip hybrid cavity PCB according to an embodiment. As illustrated in FIG. 8, a printed circuit board 800 includes embedded trace technology 810 to enable installation of a first silicon module 844 and a second silicon module 840. In some embodiments, the PCB 800 further includes additional layers 855 built up above the surface of the embedded trace layer to create a cavity into which the modules 840 and 844 are placed. In some embodiments, module 840 is installed on the embedded traces 810, while module 844 is flipped to attach a top of module 844 to a top of module 840, such as with spacer 842 between the modules. In some embodiments, the module 844 is connected by wire bond connections 846, wherein a top PCB layer includes bonding pads for interconnection of the bonding wired. In some embodiments, the printed circuit board further includes one or more SMT installed components 830, 832.

In addition to the other advantages of embedded trace technology to provide high density routing for flip chip attach, the embodiment illustrated in FIG. 8 enables a stacked silicon assembly within the cavity.

FIG. 9 is an illustration of a process for fabrication of a system including the embedded trace technology. In some embodiments, a process includes:

905: Fabrication of embedded traces in a printed circuit board, wherein the process may include the processes illustrated in FIGS. 2A to 2K, and wherein the process enables high density routing in a top layer of the PCB.

910: Lamination of any additional layers for the PCB in other areas of the board. In some embodiments, the process may optionally include generating a cavity in the PCB by the additional layers 755 or 855 as illustrated in FIG. 7 or FIG. 8 respectively.

915: Installation of a first module on the embedded traces. In some embodiments, a second module may be stacked on the first module.

920: In a particular implementation, the process may further include installation of wire bond second module on a top of the installed module and installation of the wire connections for the second module. In some embodiments, the installation and wire connection may be as illustrated in FIG. 8.

925: The process may then proceed with the installation of one or more surface mount devices on a top or bottom side of the PCB. In this manner, the process allows for both installation of a module on the embedded traces together with the surface mounting of devices, thereby simplifying and reducing the cost of the installation.

Figure 10:
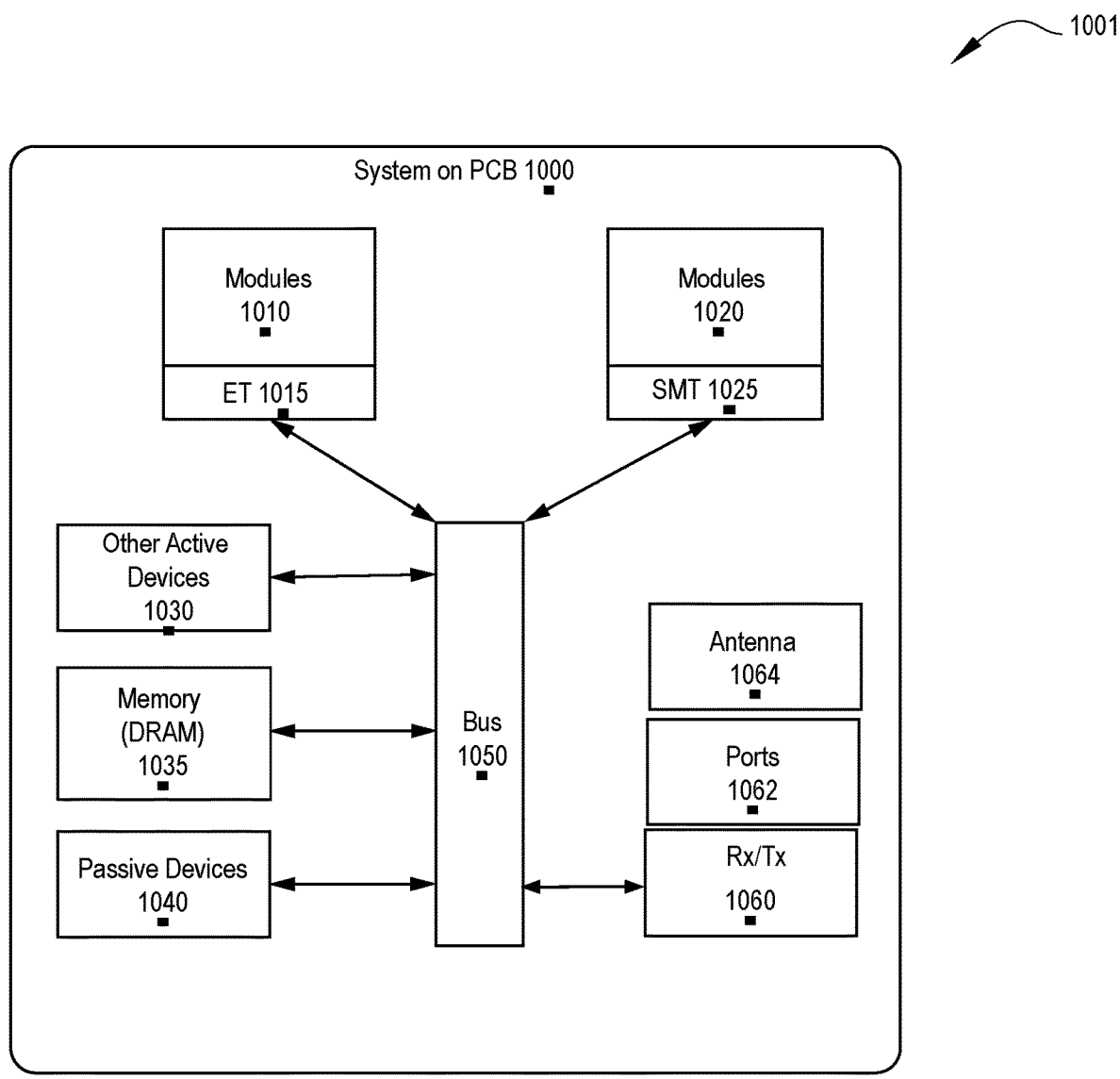
FIG. 10 is an illustration of a system including one or more one or more modules installed using embedded trace technology according to an embodiment.

FIG. 10 is an illustration of a system including one or more one or more modules installed using embedded trace technology according to an embodiment. In this illustration, certain standard and well-known components that are not germane to the present description are not shown.

In some embodiments, a system PCB or other system 1000 includes one or more installed modules, wherein the modules may include one or more modules 1010 installed utilizing embedded trace technology 1015 and one or more modules 1020 installed using surface mount technology 1025. The modules 1010 and 1020 may include any or all of the elements illustrated herein as a part of the system 1000.

In some embodiments, the system 1000 includes a processing means such as one or more processors 1030 coupled to one or more buses or interconnects, shown in general as bus 1050. The processors 1010 may comprise one or more physical processors and one or more logical processors. In some embodiments, the processors may include one or more general-purpose processors or special-processor processors.

The bus 1050 is a communication means for transmission of data. The bus 1050 is illustrated as a single bus for simplicity, but may represent multiple different interconnects or buses and the component connections to such interconnects or buses may vary. The bus 1050 shown in FIG. 10 is an abstraction that represents any one or more separate physical buses, point-to-point connections, or both connected by appropriate bridges, adapters, or controllers.

In some embodiments, the system 1000 further comprises a random access memory (RAM) or other dynamic storage device or element as a main memory 1015 for storing information and instructions to be executed by the processors 1010. Main memory 615 may include, but is not limited to, dynamic random access memory (DRAM).

The system 1000 also may comprise one or more passive devices 1040, such as capacitors and inductors, that are installed in the printed circuit board.

In some embodiments, the system 1000 includes one or more transmitters or receivers 1060 coupled to the bus 1050. In some embodiments, the system 1000 may include one or more antennae 1064 (internal or external), such as dipole or monopole antennae, for the transmission and reception of data via wireless communication using a wireless transmitter, receiver, or both, and one or more ports 1062 for the transmission and reception of data via wired communications. Wireless communication includes, but is not limited to, Wi-Fi, Bluetooth™, near field communication, and other wireless communication standards.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a printed circuit board includes one or more layers including a top layer; a plurality of embedded traces contained in an area of a surface of a first layer of the one or more layers of the printed circuit board; and a first module installed on the plurality of embedded traces in the area.

In some embodiments, the printed circuit board further includes a solder mask on the top layer of the printed circuit board, and wherein the solder mask is not included in the area that contains the plurality of embedded traces.

In some embodiments, the printed circuit board further includes one or more surface mount technology components installed on the top layer or a bottom layer of the printed circuit board.

In some embodiments, the one or more layers of the printed circuit board include a plurality of layers.

In some embodiments, the first layer is the top layer of the printed circuit board and the other layers of the plurality of layers are built below the first layer.

In some embodiments, the plurality of layers include one or more layers above the first layer, the one or more layers forming a cavity, the first module being installed in the cavity.

In some embodiments, the printed circuit board further includes a second module, the second module being stacked on the first module.

In some embodiments, the second module is a wire bond module including one or more bonding wires, the top layer of the plurality of layers including one or more contacts for connection of the one or more bonding wires.

In some embodiments, a method for fabrication of a printed circuit board includes fabricating one or more circuit board layers including a top layer, wherein fabricating the top layer includes generating a plurality of embedded traces in an area of a surface of a first layer of the one or more circuit board layers; and installing a first module on the plurality of embedded traces in the area.

In some embodiments, the method further includes installing a solder mask on the top layer, and wherein the solder mask is not included in the area that contains the plurality of embedded traces.

In some embodiments, the method further includes installing one or more surface mount technology components on the top layer or a bottom layer of the one or more layers.

In some embodiments, fabricating the one or more circuit board layers includes fabricating a plurality of circuit board layers.

In some embodiments, the first layer is the top layer and the other layers of the plurality of circuit board layers are built below the first layer.

In some embodiments, the plurality of circuit board layers includes one or more layers above the first layer, the one or more layers forming a cavity, wherein installing the first module includes installing the first module in the cavity.

In some embodiments, the method further includes stacking a second module on the first module.

In some embodiments, the second module is a wire bond module including one or more bonding wires, and further comprising generating one or more contacts on the top layer of the plurality of circuit board layers for connection of the one or more bonding wires.

In some embodiments, a system includes one or more modules including a first module, the one or more modules including one or more of a processor for processing data, a memory for storage of data, and a transmitter or receiver and antenna for transmission and reception of data; and a printed circuit board including one or more layers including a top layer, and a plurality of embedded traces contained in an area of a surface of a first layer of the one or more layers of the printed circuit board, wherein the first module is installed on the plurality of embedded traces in the area.

In some embodiments, the system further includes one or more surface mount technology components installed on the top layer or a bottom layer of the printed circuit board.

In some embodiments, the one or more layers of the printed circuit board include a plurality of layers.

In some embodiments, the first layer is the top layer of the printed circuit board and the other layers of the plurality of layers are built below the first layer.

In some embodiments, the plurality of layers include one or more layers above the first layer, the one or more layers forming a cavity, the first module being installed in the cavity.

In some embodiments, the one or more modules include a second module, the second module being stacked on the first module.

In some embodiments, the second module is a wire bond module including one or more bonding wires, the top layer of the plurality of layers including one or more contacts for connection of the one or more bonding wires.

What is claimed is:

1. A printed circuit board comprising:
   one or more layers including a top layer;
   a plurality of embedded traces contained in an area of a surface of a first layer of the one or more layers of the printed circuit board;
   a first module installed on the plurality of embedded traces in the area, the first module coupled directly to the plurality of embedded traces by corresponding ones of a plurality of solder balls; and
   a solder mask on the top layer of the printed circuit board.

2. The printed circuit board of claim 1, further comprising one or more surface mount technology components installed on the top layer or a bottom layer of the printed circuit board.

3. The printed circuit board of claim 1, wherein the one or more layers of the printed circuit board include a plurality of layers.

4. The printed circuit board of claim 3, wherein the first layer is the top layer of the printed circuit board and the other layers of the plurality of layers are built below the first layer.

5. The printed circuit board of claim 3, wherein the plurality of layers include one or more layers above the first layer, the one or more layers forming a cavity, the first module being installed in the cavity.

6. The printed circuit board of claim 5, further comprising a second module, the second module being stacked on the first module.

7. The printed circuit board of claim 6, wherein the second module is a wire bond module including one or more bonding wires, the top layer of the plurality of layers including one or more contacts for connection of the one or more bonding wires.

8. A system comprising:
   one or more modules including a first module, the one or more modules including one or more of:
   a processor for processing data, a memory for storage of data, and a transmitter or receiver and antenna for transmission and reception of data; and
   a printed circuit board including:
      one or more layers including a top layer, and a plurality of embedded traces contained in an area of a surface of a first layer of the one or more layers of the printed circuit board; and
      a solder mask on the top layer of the printed circuit board;
      wherein the first module is installed on the plurality of embedded traces in the area, wherein the first module is coupled directly to the plurality of embedded traces by corresponding ones of a plurality of solder balls.

9. The system of claim 8, further comprising one or more surface mount technology components installed on the top layer or a bottom layer of the printed circuit board.

10. The system of claim 8, wherein the one or more layers of the printed circuit board include a plurality of layers.

11. The system of claim 10, wherein the first layer is the top layer of the printed circuit board and the other layers of the plurality of layers are built below the first layer.

12. The system of claim 10, wherein the plurality of layers include one or more layers above the first layer, the one or more layers forming a cavity, the first module being installed in the cavity.

13. The system of claim 12, wherein the one or more modules include a second module, the second module being stacked on the first module.

14. The system of claim 13, wherein the second module is a wire bond module including one or more bonding wires, the top layer of the plurality of layers including one or more contacts for connection of the one or more bonding wires.

* * * * *